United States Patent [19]

Maas et al.

[11] Patent Number: 4,981,806
[45] Date of Patent: Jan. 1, 1991

[54] METHOD OF MANUFACTURING A SEMICONDUCTOR DEVICE

[75] Inventors: Henricus G. R. Maas; Roland A. Van ES; Johannes W. A. Van Der Velden; Peter H. Kranen, all of Eindhoven, Netherlands

[73] Assignee: U.S. Philips Corporation, New York, N.Y.

[21] Appl. No.: 504,194

[22] Filed: Apr. 3, 1990

[30] Foreign Application Priority Data

Apr. 5, 1989 [GB] United Kingdom ............... 8907610

[51] Int. Cl.⁵ .................. H01L 21/331; H01L 21/38
[52] U.S. Cl. ......................................... 437/31; 437/32; 437/46; 437/55; 437/162; 148/DIG. 10; 148/DIG. 11; 148/DIG. 96; 357/35; 357/59
[58] Field of Search ............... 437/31, 32, 33, 162, 437/909, 917, 46, 55, 158; 148/DIG. 10, DIG. 11, DIG. 96, DIG. 31, DIG. 44; 357/34, 35, 59 H

[56] References Cited

U.S. PATENT DOCUMENTS

| | | | |
|---|---|---|---|
| 4,338,138 | 7/1982 | Cavahere et al. .................. 357/34 |
| 4,378,630 | 4/1983 | Horng et al. ...................... 357/34 |
| 4,674,173 | 6/1987 | Hahn et al. ....................... 357/34 |
| 4,703,554 | 11/1987 | Havemann ....................... 357/34 |
| 4,757,027 | 7/1988 | Vora ................................. 437/55 |
| 4,769,687 | 9/1988 | Nakazato et al. .................. 357/35 |
| 4,887,145 | 12/1989 | Washino et al. ................... 357/35 |

Primary Examiner—Brian E. Hearn
Assistant Examiner—Tuan Nguyen
Attorney, Agent, or Firm—Paul R. Miller

[57] ABSTRACT

A device area (16) is defined in a semiconductor body (10) by forming at one major surface (12, 12a) of the body a step (11) having a side wall (11a) and top surface (11b) bounding the device area 16. A silicon layer (13) is deposited so as to cover the side wall (11a) and top surface (11b) of the step and an adjoining lower surface area (12c). Dopant impurities are introduced so that the side wall silicon region (13a) is shielded from the dopant impurities and the undoped side wall silicon region (13a) is later removed by selective etching. The silicon region (13c) on the lower surface area (12a) adjoining the step (11) is masked and the silicon region (13a) on the top surface (11b) at the step (11) removed to leave the doped silicon region (13c) on the one major surface (12a) for contacting a device region (29), for example the base region of a transistor, of the device area.

12 Claims, 4 Drawing Sheets

METHOD OF MANUFACTURING A SEMICONDUCTOR DEVICE

This invention relates to a method of manufacturing a semiconductor device, which method comprises providing a semiconductor body having a device area defined adjacent one major surface of the semiconductor body, depositing a layer of silicon on the one major surface, introducing dopant impurities into the silicon layer with a region of the silicon shielded from the dopant impurities to form a doped silicon region on the one major surface for contacting a device region of the device area, and etching the silicon layer selectively so as to remove the undoped silicon region.

Such a method is described in a paper entitled 'SDX: A novel self-aligned technique and its application to high speed bipolar LSIs' by Yousuke Yamamoto and Kazuhito Sakuma published in IEEE transactions on electron devices volume 35 No. 10 October 1988 at pages 1601 to 1608.

In the method described in the afore-mentioned paper, the silicon layer is deposited as an undoped polycrystalline silicon layer onto a surface having silicon oxide regions surrounding a silicon island which is covered by a silicon nitride masking layer and the dopant impurities in the form of boron ions are introduced into the polycrystalline silicon by a thermal diffusion process which causes boron ions previously implanted or diffused into the silicon oxide and silicon nitride layers to diffuse outwardly into the overlying polycrystalline silicon layer. The method described in the afore-mentioned paper relies on the fact that boron diffuses relatively easily out of silicon oxide but very little boron diffuses out of the silicon nitride layer. The polycrystalline silicon layer lying over the silicon nitride layer thus remains substantially undoped and can then be selectively etched away using a suitable selective etchant, potassium hydroxide as described in the paper. After removal of the silicon nitride layer to expose the underlying silicon island impurities can then be introduced into the silicon island to form base and emitter regions so that the doped polycrystalline silicon regions provide electrical contact to side walls of the base region of the thus formed bipolar transistor.

The method described in the paper thus relies on the relative rates of diffusion of boron out of the silicon oxide and silicon nitride layers which may be difficult to control and may vary with process conditions. As the boron diffusion occurs only from the upper region of the silicon oxide, this method requires an implantation process which uses low acceleration voltages but provides a high boron dose so that the implantation is time-consuming taking of the order of an hour per slice. Moreover, the thermal diffusion process converting the silicon oxide into boron glass will also convert at least some of the silicon nitride into boron glass which may then dope the subsequent polycrystalline silicon layer. Also, the method described in the aforementioned paper requires the use of a masking silicon nitride layer beneath the polycrystalline silicon region which is not to be doped and such a method could not be adopted when the doped polycrystalline silicon region is to be provided on a surface adjoining a side wall of a step because the doped polycrystalline silicon region would not then be able to contact the side wall of the step. of manufacturing a semiconductor device, which method providing a semiconductor body having a device area defined adjacent one major surface of the semiconductor body depositing a layer of silicon on the one major surface, introducing dopant impurities into the silicon layer with a region of the silicon shielded from the dopant impurities to form a doped silicon region on the one major surface for contacting a device region of the device area, and etching the silicon layer selectively so as to remove the undoped silicon region, characterised by defining the device area by forming at the one major surface a step having a side wall and top surface bounding the device area, depositing the silicon layer so as to cover the side wall and top surface of the step and an adjoining lower surface area, introducing the dopant impurities with the side wall silicon region shielded from the dopant impurities so that the undoped side wall silicon region is removed by the selective etching, masking the silicon region on the lower surface area adjoining the step and removing the silicon region on the top surface of the step.

Thus, a method embodying the invention enables a doped silicon layer for contacting a device region to be formed adjacent a step in the one major surface of the semiconductor body by introducing the dopant impurities into the surface of the silicon layer in such a manner that the side wall silicon region is shielded from the dopant impurities so that the undoped side wall silicon region can be selectively etched away enabling a doped silicon region to be provided adjacent the step for contacting a device region of the device area without the need for a masking layer beneath the polycrystalline silicon layer and without having to rely on the relative rates of diffusion of the dopant impurities out of underlying layers. In addition, a method in accordance with the invention does not require a lengthy low acceleration voltage, high dose implantation process.

Preferably, the dopant impurities are introduced by implantation of boron ions so that the side wall silicon region is automatically shielded from the dopant impurities by virtue of the directionality of the implantation process and by the shielding effect provided by the silicon region on the top surface of the step. Normally the silicon layer is deposited as a polycrystalline silicon layer, however the silicon layer could be deposited as an amorphous silicon layer which could then be recrystallised during a subsequent process, for example a heat treatment to cause diffusion of implanted ions.

The inventors have found that, surprisingly, the introduction of the impurities into the surface of the silicon layer is not a particularly critical step so that, for example, where the impurities are introduced by implantation and subsequent diffusion, the length of the diffusion process is not particularly critical. Indeed, the inventors have found that the rate at which the introduced dopant impurities diffuse into the polycrystalline silicon on the side wall of the step is significantly lower than the rate at which the impurities diffuse into the polycrystalline silicon regions on the lower surface area.

It is believed that this significant rate difference is related to the fact that diffusion of impurities across grain boundaries is more difficult and to the fact that the polycrystalline silicon grains grow or are aligned so that the grain boundaries tend to be aligned perpendicularly to the underlying surface. Thus, the diffusion of the boron ions downwardly into the polycrystalline silicon regions on the lower surface area should be predominantly along grain boundaries while the diffusion direction required for the impurities to enter the side wall polycrystalline silicon region will be, predominantly, across the grain boundaries and so slower.

The dopant impurities may be implanted into the silicon layer prior to masking the silicon region on the lower surface area. The silicon region on the lower surface area may then be masked by applying a flowable material to the silicon layer so as to leave the doped silicon region on the top surface of the step exposed thereby enabling the exposed doped silicon region to be etched away. The implanted impurities are then caused to diffuse through the silicon layer. This arrangement has the advantage that the length of the diffusion step is less critical because, having removed the exposed doped silicon region from the top surface of the step, diffusion of impurities can only occur from the silicon region on the surface area adjoining the step so reducing the risk of the sidewall silicon region becoming doped during the diffusion process. The silicon layer may be selectively etched to remove the undoped side wall silicon region prior to masking the doped silicon region on the lower surface area or in an alternative method the undoped side wall silicon region may be removed after removal of the doped silicon region on the top surface of the step.

In other embodiments, the flowable material for masking the silicon region on the lower surface area so as to leave the silicon region on the top surface of the step exposed may be applied prior to introducing the dopant impurities and then the exposed silicon region on the top surface of the step, selectively oxidised enabling the dopant impurities to be introduced using the oxide cap formed at the top surface of the step as a mask. This has the advantage that the dopant impurities are not introduced into the silicon region on the top surface of the step which should further reduce the possibility of undesired diffusion of the dopant impurities into the side wall silicon region.

The oxide cap may be defined in a simple manner by providing an anti-oxidation layer on the silicon layer prior to applying the flowable material, using the flowable material as a mask to remove the anti-oxidation layer from the silicon region on the top surface of the step and then oxidising the exposed silicon region. As an alternative, the oxide cap may be defined by introducing different impurities, for example implanting arsenic ions, into the exposed silicon region on the top surface of the step after defining the flowable material mask, removing the flowable material mask and then selectively oxidising the silicon layer so that the silicon region into which the different impurities were introduced oxidises more quickly than the remainder of the silicon layer.

The step may be defined so that an insulating layer covering the side wall of the step separates the doped silicon region on the lower surface area from the device area. In such an embodiment, the exposed portion of the insulating layer on the side wall of the step may then be removed from the side wall and a further layer of silicon deposited over the doped silicon region, the side wall and top surface of the step. The dopant impurities may then be caused to diffuse out of the doped silicon region into the overlying silicon layer, and the undoped regions of the further silicon layer selectively etched away.

This has the advantage that the doped silicon region only contacts an upper part of the device area. This has particular advantages where, for example, during subsequent processing the dopant impurities are caused to diffuse out of the doped silicon region to provide within the device area a contact region for enabling good contact to the device region in that it reduces the possibility of the contact region being formed too close to an underlying layer of the device. Thus, for example, where the base and emitter region of a bipolar transistor are to be formed within the device area and a buried region forming part of the collector region of the device is provided in the semiconductor body beneath the step, then the base-collector capacitance may be reduced by controlling as described above the diffusion of the dopant impurities into the semiconductor body so that the contact region for contacting the base region is spaced from the buried collector region.

It should be noted that European Patent Application No. EP-A-76942 describes a method of forming a mask for defining isolation trenches in a semiconductor body in which, after formation of an insulating layer on the surface of the semiconductor body, a, for example, polycrystalline silicon layer is deposited and patterned anisotropically to define one or more steps. After formation of a thin insulating layer, impurities are implanted into the semiconductor body using the polycrystalline silicon steps as a mask. A further layer of polycrystalline silicon is then deposited into which boron ions are implanted. Undoped polycrystalline silicon on the side walls of the polycrystalline silicon steps is then selectively etched away providing windows through which the thin insulating layer is then etched to form windows exposing the surface of the semiconductor body. The further polycrystalline silicon layer and thin insulating layer are then etched away followed by the polycrystalline silicon steps. The polycrystalline silicon steps are etched away using an anisotropic process such as reactive ion etching which also etches the silicon exposed by the windows to form isolation trenches, aligned with the implanted impurities, which are subsequently filled with a dielectric material.

Embodiments of the invention will now be described, by way of example, with reference to the accompanying drawings, in which.

Figure 1:
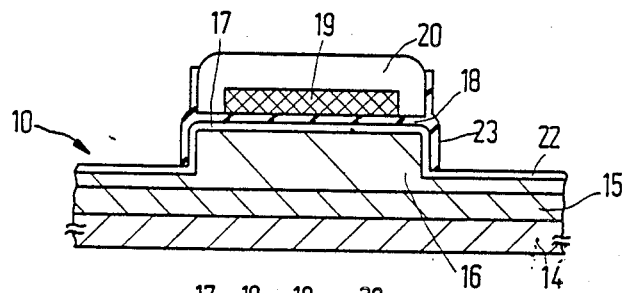
FIGS. 1, 2, 3, 4, 5 are schematic cross-sectional views of a semiconductor body illustrating steps in the manufacture of a bipolar transistor using a method in accordance with the invention.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Figure 6:
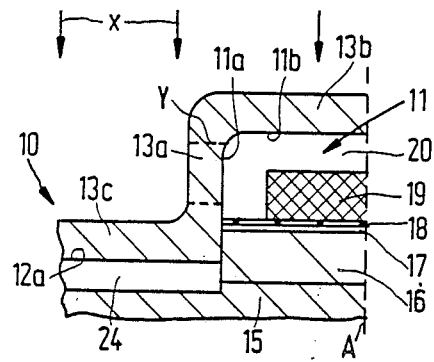
FIGS. 6, 7, 8 are enlarged schematic cross-sectional views of part of the semiconductor body shown in FIGS. 1 to 5 for illustrating a first embodiment of a method in accordance with the invention.
Figure 7:
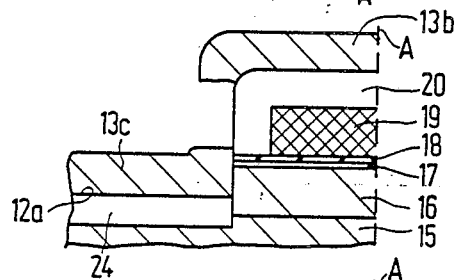
Figure 8:
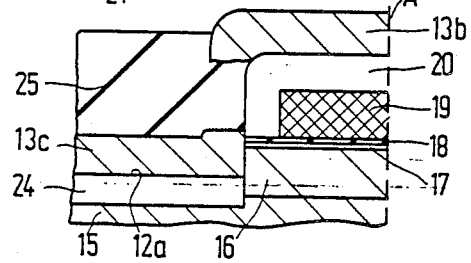

Referring now to the drawings, for example FIGS. 6 to 8, a method of manufacturing a semiconductor device comprises providing a semiconductor body 10 having a device area 16 defined adjacent one major surface 12, 12a of the semiconductor body 10, depositing a layer 13 of silicon on the one major surface 12, 12a, introducing dopant impurities into the silicon layer 13 with a region 13a of the silicon shielded from the dopant impurities to form a doped silicon region 13c on the one major surface 12a or contacting a device region 29 of the device area 16 and etching the silicon layer 13 selectively so as to remove the undoped silicon region 13a.

In accordance with the invention, the method further comprises defining the device area 16 by forming at the one major surface 12, 12a a step 11 having a side wall 11a and top surface 11b bounding the device area 16, depositing the silicon layer 13 so as to cover the side wall 11a and top surface 11b of the step and an adjoining lower surface area 12c. introducing the dopant impurities so that the side wall silicon region 13a is shielded from the dopant impurities so that the undoped side wall silicon region 13a is removed by the selective etching masking the silicon region 13c on the lower surface (area 12a adjoining the step 11 and removing the silicon region 13b a on the top surface 11b of the step 11.

FIGS. 1 to 5 illustrate a method of manufacturing a bipolar transistor using a method in accordance with the invention.

Referring firstly to FIG. 1, the semiconductor body 10 comprises, in this example, a monocrystalline silicon substrate 14 doped with p conductivity type impurities into which n conductivity type impurities have been implanted to form a highly doped layer 15 which is subsequently buried by a more lowly doped n conductivity type epitaxial silicon layer 16 which will form the device area as will be described below. Typically, the epitaxial layer may he about 1 micrometer thick and may have a dopant concentration of about $10^{16}$ atoms $cm^{-3}$.

The step 11 is defined at the major surface 12 of the semiconductor body 10 in the following manner. First, a thin, for example about 50 nanometers (nm), insulating layer 17 of silicon oxide or silicon oxynitride is provided on the one major surface 12 followed by a first silicon nitride layer 18 having a thickness of about 100 nm to form an anti-oxidation layer and an undoped polycrystalline silicon layer having a thickness of about 1.2 micrometers. Subsequently, the undoped polycrystalline silicon layer is defined by conventional photolithographic and etching processes and is subjected to a conventional thermal oxidation treatment to produce an oxide layer 20 on the remaining undoped polycrystalline silicon region 19.

The exposed regions of the insulating layer 17 and first silicon nitride layer 18 are then removed using a selective etching process preferably a plasma etching process or, for example, by etching successively in hot phosphoric acid and in a buffered solution of HF in water.

A depression is then etched into the semiconductor body 10 using the oxide layer 20 as a mask. The depression may be in the form of a groove having a depth of about 0.8 micrometers so that, in this example, the groove does not extend into the buriedlayer 15. Although not shown in FIG. 1, the epitaxial layer 16 may be slightly underetched to facilitate subsequent processing.

A further anti-oxidation layer comprising a silicon oxide layer 23 and a second silicon nitride layer is then provided. The silicon nitride layer is then etched anisotropically, for example using a carbon hydrofluoride plasma etching process, to remove the parts of the silicon nitride layer lying on surfaces parallel to the epitaxial layer 16 and the buried layer 15 so as to leave an anti-oxidation mask silicon nitride region 23 on the side wall of the groove as shown in FIG. 1. The exposed silicon surfaces are then subjected to a conventional thermal oxidation treatment to form a first countersunk oxide region 24. The second anti-oxidation mask 23 and the underlying silicon oxide layer 22 may then be removed leaving the step 11 bounded by the countersunk oxide region 24 which in this example provides the lower surface area 12a of the one major surface 12 of the semiconductor body 14.

Figure 2:
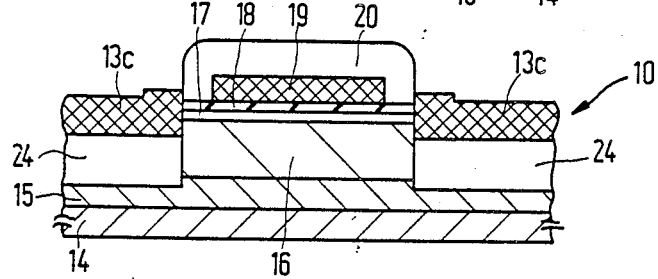

After the step 11 has been defined, an undoped polycrystalline silicon layer 13 is deposited using conventional chemical vapour deposition techniques. Using one of the methods to be described below, the undoped polycrystalline silicon layer 13 is processed to provide, as shown in FIG. 2, a relatively flat doped polycrystalline silicon region 13c on the lower surface area 12a for contacting a device region 29 of the device area 16.

Figure 3:
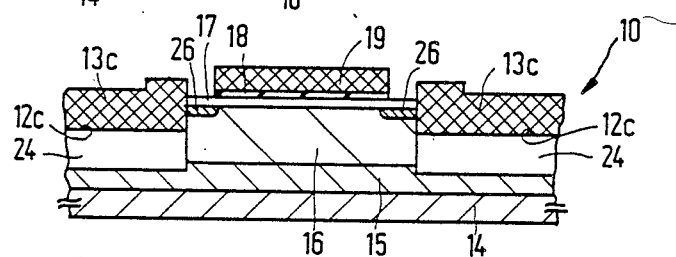
Figure 4:
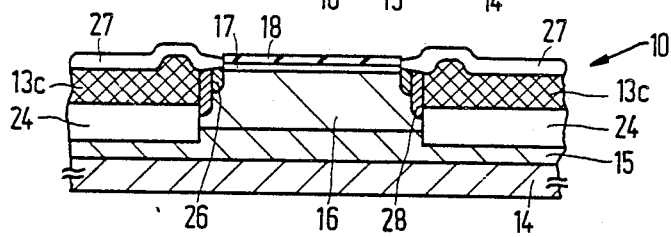

The oxide layer 20 and the exposed areas of the first silicon nitride layer 18, if still remaining after formation of the relatively flat doped polycrystalline silicon region 13c, are then etched away and acceptor ions, for example boron ions, are implanted for defining a p conductivity type intermediate device region 26 adjoining the p-conductivity type polycrystalline silicon region 13c as shown in FIG. 3. Alternatively, the acceptor ions may be implanted after removal of the undoped polycrystalline silicon region 19.

The undoped polycrystalline silicon region 19 is then removed using an appropriate selective etchant, for example potassium hydroxide or sodium hydroxide as described above, and the exposed silicon is provided with a second oxide layer 27 by thermal oxidation in a manner similar to that used to form the countersunk oxide layer 24. During the high temperature processing to form the second oxide layer 27, the diffusion of p-type impurities out of the doped polycrystalline silicon region 13c results in a highly doped p-conductivity type contact region 28 between the doped polycrystalline silicon region 13c and the intermediate region 26 to produce the structure shown in FIG. 4.

Figure 5:
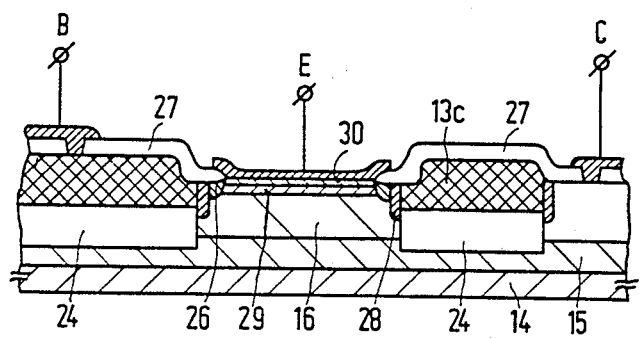

The remaining silicon oxide and silicon nitride layers 17 and 18 are then etched away and p-conductivity type impurities and subsequently n-conductivity type impurities are then implanted to form a p-conductivity type base region 29 and an n-conductivity type emitter region 30 within the epitaxial layer 16 which itself forms part of the collector region. Contact windows are then opened in the usual manner and metallisation applied to form the base B, emitter E and collector C contacts as shown in FIG. 5.

FIGS. 6 to 8 are enlarged views of part of the semiconductor body 10 illustrating a first embodiment of a method In accordance with the invention for forming the relatively flat doped polycrystalline silicon region 13c as shown in FIG. 2.

In this example after deposition of the undoped polycrystalline silicon layer 13, the dopant impurities, in this case boron ions, are implanted into the surface of the polycrystalline silicon layer 13 as indicated by the arrows X in FIG. 6. The dose and energy of the boron ions implantation are selected so as to provide a surface concentration after diffusion of greater than $6 \times 10^{19}$ atoms $cm^{-2}$ requiring an implantation dose in, for example, a 0.6 micrometers thick layer of polycrystalline silicon of greater than $3.6 \times 10^{15}$ atoms $cm^{-2}$, in practice about $10^{16}$ atom $cm^{-2}$. Where $BF_2{}^+$ ions are used then the implantation energy may be 120 KeV (kiloelectron volts) whereas where $B^+$ ions are used the implantation energy may be 30 KeV. Because of the anisotropic nature of the ion implantation as indicated by the arrows x, the ions are implanted into the surface of the polycrystalline regions 13 and 13c on the top surface 11b of the step 11 and into the lower surface area 12a but not to any significant extent into the polycrystalline silicon region 13a on which side wall 11a of the step which has a surface extending nearly parallel to the direction of implantation and is in effect shielded from the implantation by the polycrystalline silicon region 13b on the top surface 11b of the step.

After the implantation step, the semiconductor body 10 is subjected to a heat treatment to allow the implanted ions to diffuse into the polycrystalline silicon for a predetermined extent. In this example, the semiconductor body 10 may be heated to about 925° C. (degrees Celsius) for from 2.5 to 3 hours for this purpose, although the length of the diffusion time required will, of course, depend on the temperature selected and the thickness and structure of the polycrystalline silicon layer 13.

The length of the diffusion time should be selected so that there is very little diffusion of the implanted ions into the polycrystalline silicon region 13a on the side wall 11a of the step. In practice, the inventors have found that the length of the diffusion time is not that critical because, surprisingly, the rate at which the boron ions implanted into the polycrystalline silicon regions 13c and 13b diffuse into the polycrystalline silicon region 13a is significantly retarded with respect to the rate at which the implanted boron ions diffuse downwardly through the thickness of the polycrystalline silicon regions 13a and 13c. It is believed that this significant rate difference is related to the fact that diffusion of impurities across grain boundaries is more difficult and to the fact that the polycrystalline silicon grains tend to grow or be aligned so that the grain boundaries tend to be aligned perpendicularly to the underlying surface. Thus, the diffusion of the boron ions downwardly into the polycrystalline silicon regions 13b and 13c should be predominantly along grain boundaries whilst the diffusion direction required for the impurities to enter the polycrystalline silicon region 13a will be, predominantly, across the grain boundaries and so is lower.

The dashed lines Y in FIG. 6 illustrate approximately the extent of the diffusion of the boron ions after the above described diffusion process and thus show the extent of the undoped polycrystalline silicon region 13a on the side wall 11a of the step 11.

The exposed polycrystalline silicon layer 13 is then subjected to an etching process which selectively etches the undoped polycrystalline silicon region 13a to leave the structure shown in FIG. 7. Any suitable selective etchant may be used, for example potassium hydroxide or sodium hydroxide.

A flowable material, for example a photosensitive resist, is then applied to the structure and patterned using conventional masking and lithographic techniques to define the mask layer 25 shown in FIG. 8 which masks the doped polycrystalline silicon region 13c but which leaves the doped polycrystalline silicon region 13b exposed. The exposed doped polycrystalline silicon region 13b indicated in phantom lines in FIG. 8 is then removed using the mask layer 25 as a mask with a suitable etchant, for example, an $HNO_3$—HF mixture or a plasma etching process, to leave the structure shown in FIG. 2. Subsequently, the mask layer 25 is removed by conventional means so that the relatively flat or planar doped polycrystalline silicon region 13c remains as shown in FIG. 2 to enable electrical contact to be provided to the base region 29 as described above.

A second embodiment of a method in accordance with the invention for forming the relatively flat doped polycrystalline region 13c shown in FIG. 2 will now be described with reference to FIGS. 9 to 12.

Figure 9:
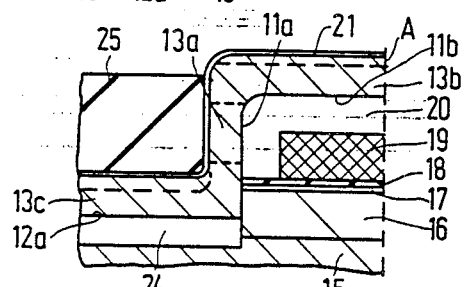
FIGS. 9, 10, 11, 12 are enlarged schematic cross-sectional views similar to FIGS. 6 to 8 for illustrating a second embodiment of a method in accordance with the invention.
Figure 10:
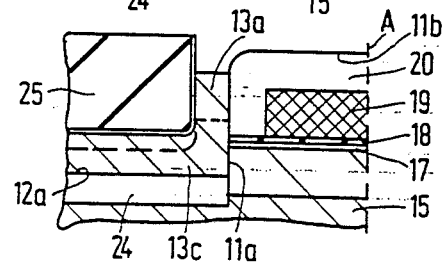
Figure 11:
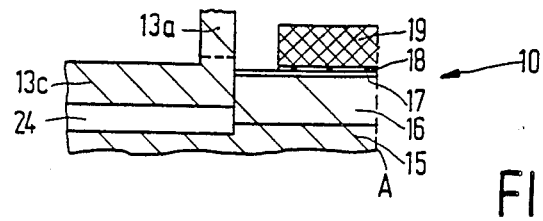

As shown by FIG. 9, after deposition of the undoped polycrystalline silicon layer 13 in the manner described above, a thin protective layer 21 is formed on the polycrystalline silicon. In this example, the thin protective layer 21 is a thin layer of thermal oxide formed to protect the polycrystalline silicon layer 13 and may be omitted if desired.

Boron ions are then implanted as described above, the dashed lines W in FIG. 9 indicating schematically the depth of penetration of the implanted boron ions. The thin layer 21 of thermal oxide acts as an extra shield against implantation of boron ions into the region 13a.

Next, instead of subjecting the semiconductor body 10 to a heat treatment to cause the implanted ions to diffuse into the polycrystalline silicon layer 13, a flowable material, for example a photosensitive resist, is applied and patterned as described above to form the mask layer 25 (FIG. 9) leaving the implanted polycrystalline silicon region 13b on the top surface 11b of the step 11 exposed. The exposed polycrystalline silicon region 13b and overlying thin oxide are then etched away using a wet etch, for example $HNO_3$—HF, during which process the thin oxide layer 21 acts as an etch barrier, or an isotropic or anisotropic plasma etch process to leave the structure shown in FIG. 10.

The mask layer 25 is then removed using conventional HF mixtures which also remove the oxide layer 20 and thin oxide layer 30 and the semiconductor body 10 is then subjected to the heat treatment described above to cause the implanted boron ions to diffuse downwardly into the polycrystalline silicon region 13a. After the prescribed diffusion time (as described above to 2.5 to 3 hours where the semiconductor body is heated to 925° C. and the polycrystalline silicon layer 13 is about 0.6 micrometers thick), the exposed portion of the silicon nitride layer 18 is removed using the undoped polycrystalline silicon region 19 is a mask to produce the structure shown in FIG. 11.

Figure 12:
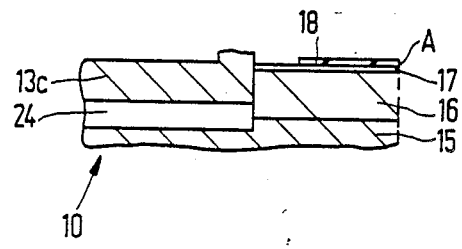

The undoped polycrystalline silicon region 13a is then removed using the selective etching process described above (potassium hydroxide or sodium hydroxide) at the same time removing the exposed undoped polycrystalline region 19 as shown in FIG. 12. Thus, in this example, the result of the formation of the relatively flat doped polycrystalline silicon region 13c is a structure similar to that shown in FIG. 3 but with the undoped polycrystalline silicon region 19 removed. In this example, the impurities to form the intermediate region 26 may be introduced using merely the remaining silicon nitride layer 18 as a mask or the intermediate region 26 may be omitted so that connection between the doped polycrystalline silicon region 13c and the device region 19 is directly via the contact region 2B. The method then proceeds as described above with reference to FIGS. 4 and 5 with the formation of the second oxide layer 27 and so on to form the bipolar transistor structure shown in FIG. 5.

Figure 13:
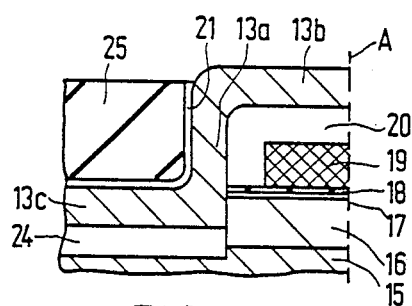
FIGS. 13 and 14 are enlarged schematic cross-sectional views similar to FIGS. 6 to 8 for illustrating a third embodiment of a method in accordance with the invention.

A third alternative method of forming the doped polycrystalline silicon region 13c will be described below with reference to FIGS. 13 and 14.

The undoped polycrystalline silicon layer 13 is again covered by a thin protective layer 21. However, in this example, the thin protective layer 21 is in the form of an anti-oxidation layer, in particular a silicon nitride layer.

Again the flowable material mask layer 25 is provided and patterned as described above to leave the polycrystalline silicon region 13b, covered by silicon nitride, exposed. The exposed silicon nitride is then removed to form the structure shown in FIG. 13 followed by removal of the mask layer 25.

The semiconductor body 10 is then subjected to thermal oxidation treatment similar to that described above for forming the countersunk first oxide layer 24 resulting in a protective oxide cap 31 on the exposed polycrystalline silicon region 13b. The protective silicon nitride layer 21 is then subjected to an anisotropic etch removing the silicon nitride 21a (shown in phantom lines in FIG. 14) from the lower surface area 12c.

Figure 14:
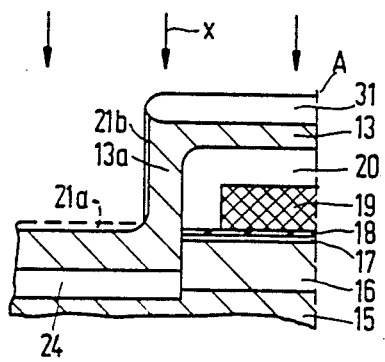

Boron ions, as indicated by the arrows X in FIG. 14, are then implanted into the surface of the exposed polycrystalline silicon region 13c and caused to diffuse as described above. In this example, as the polycrystalline silicon regions 13a and 13b are both protectively covered, if desired, a diffusion process using boron nitride rather than an implantation process may be used to introduce the boron ions into the polycrystalline silicon region 13c. The remaining silicon nitride layer 21b and the protective oxide cap 31 are then etched away leaving the undoped polycrystalline silicon regions 13a and 13b exposed to be selectively etched away to produce the structure shown in FIG. 2.

Figure 15:
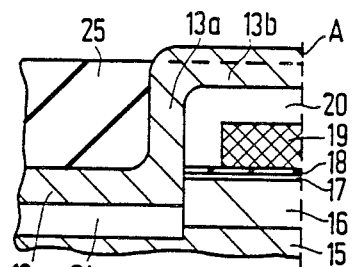
FIGS. 15 and 16 are enlarged schematic cross-sectional views similar to FIGS. 6 to 8 for illustrating a fourth embodiment of a method in accordance with the invention.
Figure 16:
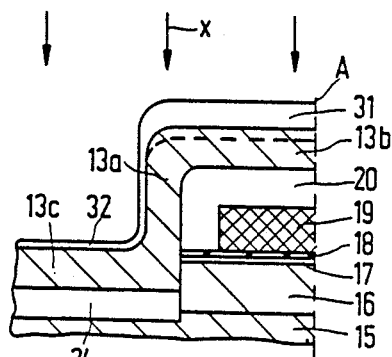

FIGS. 15 and 16 illustrate a variant of the method described above in relation to FIGS. 13 and 14 in which the protective layer 21 is omitted and after formation of the mask layer 25, arsenic ions are implanted into the exposed surface crystalline silicon region 13b. After removal of the mask layer 25, the semiconductor body 10 is again subjected to a thermal wet oxidation treatment at a temperature of from about 700 to 850 degrees C. in which the polycrystalline silicon region 13b oxidises much more quickly than the undoped polycrystalline silicon regions 13a and 13c so that a relatively thick protective oxide cap 31 is again formed on the polycrystalline silicon region 13b while a thin oxide layer 32 is formed on the undoped polycrystalline silicon regions 13a and 13c.

Boron ions are then implanted and diffused as described above with reference to FIGS. 13 and 14 and after removal of the oxide cap 31 and thin oxide layer 32, the polycrystalline silicon regions 13a and 13b are again selectively etched away resulting in the structure shown in FIG. 2.

In each of the embodiments described above, the silicon nitride region 23 is removed from the side wall 11a of the step 11 after formation of the countersunk first oxide layer 24. However, in the following two embodiments the silicon nitride region 23 and the thin oxide layer 33 which forms the silicon nitride region 23 during formation of the countersunk first oxide layer 24 is left in place.

Figure 17:
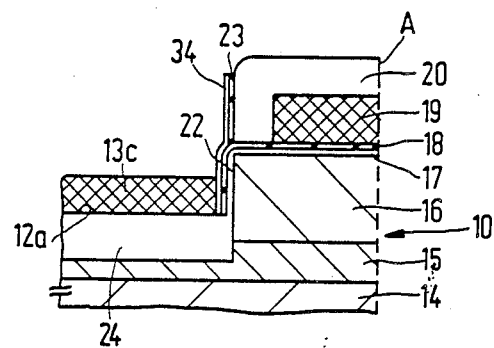
FIGS. 17 and 18 are enlarged schematic cross-sectional views similar to FIGS. 6 to 8 for illustrating a fifth embodiment of a method in accordance with the invention.

Referring now to FIG. 17, there is illustrated the situation after the doped polycrystalline silicon region 13c has been defined as described above with reference to FIGS. 6 to 8, or FIGS. 13 and 14 or FIGS. 15 and 16 but where the silicon nitride region 23 was not removed after formation of the countersunk oxide layer 24. In this example, the exposed portion of the silicon nitride region 23 is then removed leaving the doped polycrystalline silicon region 13c separated from the device area formed by the epitaxial layer 16 by an insulating layer 34 sandwich consisting of the remaining portion of the silicon oxide layer 22, the silicon nitride region 23 and the overlying thin oxide layer 33.

Figure 18:
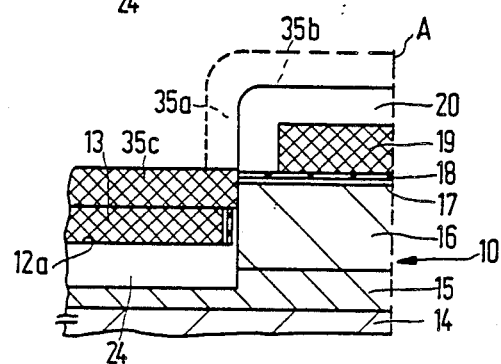

A further polycrystalline silicon layer 35 is then deposited as shown in FIG. 18 and the semiconductor body 10 heated to, for example, a temperature of about 925 degrees C. for about 90 minutes to cause the boron ions to diffuse out of the doped. polycrystalline silicon region 13c into the overlying region 35c of the further polycrystalline silicon layer 35. The undoped regions 35b and 35c of the further polycrystalline silicon layer 35 are then selectively etched away to produce a relatively flat doped polycrystalline silicon composite region consisting of the doped polycrystalline silicon region 13c and the overlying doped polycrystalline silicon region 35c.

The semiconductor body 10 is then subjected to the further processing steps as described above during which the contact region 28 (see FIG. 4) is formed by division of boron out of the doped polycrystalline silicon region 35c. In this example, however, the presence of the insulating layer 34 sandwich ensures that the diffusion of the boron out of the doped polycrystalline silicon occurs near the surface of the epitaxial layer 16 so that the distance the boron has to diffuse to reach the buried layer 5 is increased resulting in an increased separation of the contact region from the buried layer 15 and so in a reduction of the base-collector capacitance in the final transistor which should enable an improved high frequency performance.

Figure 19:
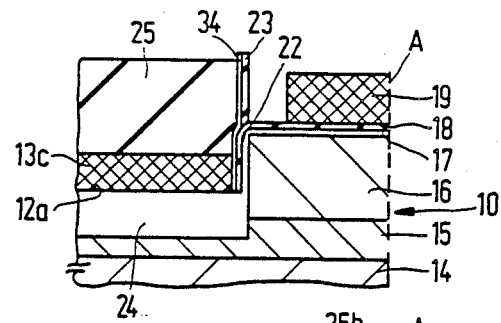
FIGS. 19 and 20 are enlarged schematic cross-sectional views similar to FIGS. 6 to 8 for illustrating a sixth embodiment of a method in accordance with the invention.

In a modified method similar to that described above with reference to FIGS. 17 and 18, after removal of the polycrystalline silicon region 13b, the oxide layer 20 is etched away to produce the structure shown in FIG. 19. The mask layer is then removed and the exposed silicon nitride layer 18, 34 selectively etched away. The further layer of undoped polycrystalline silicon 35 is then deposited to produce the structure shown in FIG. 20 and the semiconductor body 10 is heated to, for example, 925 degrees C. for 90 minutes to cause the boron ions to diffuse out of the doped polycrystalline silicon region 13c into the overlying polycrystalline silicon region 35c.

Figure 20:
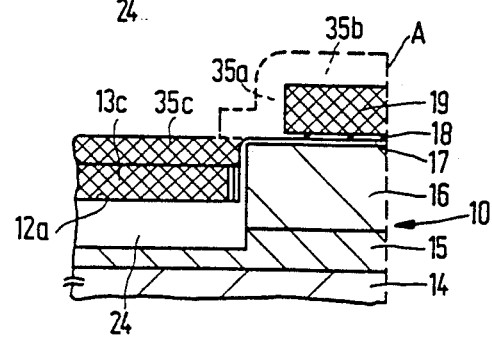

The undoped regions 35a and 35b of the further polycrystalline silicon layer 35 are then selectively etched away together with the undoped polycrystalline silicon region 19 using, for example, potassium hydroxide or sodium hydroxide resulting, as indicated by showing the undoped regions 35'a, 35b and 19 in phantom lines in FIG. 20 in a structure similar to that shown in FIG. 12. Again, the fact that the doped polycrystalline silicon is in contact only with the top portion of the epitaxial layer 16 ensures that the intermediate region 28 formed by diffusion of boron out of the doped polycrystalline silicon is well spaced from the buried layer 14 so reducing the base-collector capacitance.

Although the various embodiments have been described above with reference to the manufacture of an npn bipolar transistor of the type shown in FIG. 5, a method embodying the invention may be used in the manufacture of other types of side wall base contact bipolar transistors as described in our co-pending published European Patent Application Publication No. 0300514 corresponding to U.S. Pat. No. 4,894,702 and our co-pending European Patent Application No. 89200110.8 filed on Jan. 19, 1989 corresponding to U.S. patent application Ser. No. 301,578, filed Jan. 24, 1989, and may also be used in the manufacture of insulated gate field effect transistors of the type described in European Patent Application No. 89200110.8. Indeed, a method embodying the invention may be used in any other suitable device where it is required to make contact to a device region by means of a doped relatively flat deposited silicon region.

It should be understood that, although in the methods described above the silicon layer 13 is deposited as a polycrystalline silicon layer, it may alternatively be deposited as an amorphous layer and subsequently re-crystallised for example during the heat treatment to cause diffusion of the implanted boron ions. In addition, the use of dopant impurities other than boron ions may be possible if a suitable etchant which etches the undoped polycrystalline silicon selectively with respect to the doped polycrystalline silicon is available. Also the conductivity types given above could be reversed to enable, for example, a pnp bipolar transistor to be manufactured assuming an n conductivity type dopant and suitable etchant are available which enables selective etching of the undoped polycrystalline silicon.

From reading the present disclosure, other modifications will be apparent to persons skilled in the art. Such modifications may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device, which method comprises providing a semiconductor body having a device area defined adjacent one major surface of the semiconductor body, depositing a layer of silicon on the one major surface, introducing dopant impurities into the silicon layer with a region of the silicon shielded from the dopant impurities to form a doped silicon region on the one major surface for contacting a device region of the device area, and etching the silicon layer selectively so as to remove the undoped silicon region, characterised by defining the device area by forming at the one major surface a step having a side wall and top surface bounding the device area, depositing the silicon layer so as to cover the side wall and top surface of the step and an adjoining lower surface area, introducing the dopant impurities with the side wall silicon region shielded from the dopant impurities so that the undoped side wall silicon region is removed by the selective etching, masking the silicon region on the lower surface area adjoining the step and removing the silicon region on the top surface of the step.

2. A method according to claim 1, further characterised by depositing the silicon layer as a layer of polycrystalline silicon.

3. A method according to claim 1, further characterised by implanting boron ions as the dopant impurity.

4. A method according to claim 1, further characterised by introducing the dopant impurities into the silicon layer prior to masking the silicon region on the lower surface area.

5. A method according to claim 4, further characterised by masking the silicon region on the lower surface area by applying a flowable material to the silicon layer so as to leave the doped silicon region on the top surface of the step exposed and then etching away the exposed doped silicon region.

6. A method according to claim 5, further characterised by etching the silicon layer selectively to remove the undoped side wall silicon region prior to masking the doped silicon region on the lower surface area 7. A method according to claim 5, further characterised by etching the silicon selectively to remove the undoped side wall silicon region after removing the doped silicon region from the top surface of the step.

8. A method according to claim 1, further characterised by applying the flowable material to mask the silicon region on the lower surface area, thereby leaving the silicon region on the top surface of the step exposed prior to introducing the dopant impurities selectively oxidising the exposed silicon region on the top surface of the step, and introducing the dopant impurities using the oxide cap formed at the top surface of the step as a mask.

9. A method according to claim 8, further characterised by defining the oxide cap by providing an anti-oxidation layer on the silicon layer prior to applying the flowable material, using the flowable material as a mask to remove the anti-oxidation layer form the silicon region on the top surface of the step and then oxidising the exposed silicon region .

10. A method according to claim 8, further characterised by defining the oxide cap by introducing different impurities into the exposed silicon region on the top surface of the step after defining the flowable material mask, removing the flowable material mask and selectively oxidising the silicon layer so that the silicon region into which the different impurities were introduced oxidises more quickly than the remainder of the silicon layer.

11. A method according to claim 1, further characterised by defining the step so that an insulating layer on the side wall of the step separates the doped silicon region on the lower surface area from the device area, removing the exposed insulating layer from the side wall, depositing a further layer of silicon over the doped silicon region, the side wall and top surface of the step, causing dopant impurities to diffuse out of the doped silicon region into the overlying silicon layer, and selectively etching away the undoped regions of the further silicon layer.

12. A method according to claims 1, further characterised by defining within the device area defined by the step base and emitter regions isolated from the doped silicon region and causing impurities to diffuse out of the doped silicon region to define within the device area a contact region connecting the doped silicon region to the base region.

* * * * *